(12) United States Patent
He et al.

(10) Patent No.: US 12,068,355 B2
(45) Date of Patent: Aug. 20, 2024

(54) ARRAY SUBSTRATE, FLAT PANEL DETECTOR, AND METHOD FOR MANUFACTURING ARRAY SUBSTRATE

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN); Kun Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 421 days.

(21) Appl. No.: 17/410,677

(22) Filed: Aug. 24, 2021

(65) Prior Publication Data

US 2022/0278162 A1    Sep. 1, 2022

(30) Foreign Application Priority Data

Feb. 26, 2021   (CN) .......................... 202110219223.7

(51) Int. Cl.
*H01L 27/146*  (2006.01)
*H01L 27/12*  (2006.01)

(52) U.S. Cl.
CPC .... *H01L 27/14643* (2013.01); *H01L 27/1214* (2013.01); *H01L 27/14689* (2013.01)

(58) Field of Classification Search
CPC . G06T 1/00; G06F 3/044; G06F 3/041; H01L 27/146; H01L 27/14643; H01L 27/1214; H01L 27/14689; H01L 27/1248; H01L 27/14612; H01L 27/14683; G06V 40/1318; A61B 5/1172; G01J 1/42; G01J 1/4204
See application file for complete search history.

(56) References Cited

U.S. PATENT DOCUMENTS

| | | | |
|---|---|---|---|
| 9,954,003 B2 * | 4/2018 | Matsuda | H01L 29/78648 |
| 2017/0013214 A1 * | 1/2017 | Ohmaru | H04N 25/583 |
| 2017/0243909 A1 * | 8/2017 | Kurokawa | H10K 39/32 |
| 2018/0102393 A1 * | 4/2018 | Liu | H01L 31/03762 |
| 2019/0243497 A1 * | 8/2019 | Zhang | H01L 27/1218 |
| 2021/0028314 A1 * | 1/2021 | Saitoh | H01L 29/66969 |
| 2021/0175274 A1 * | 6/2021 | Yoon | H01L 27/14612 |
| 2021/0240963 A1 * | 8/2021 | Nakamura | G06T 1/00 |
| 2022/0058365 A1 * | 2/2022 | Tomioka | H01L 27/14685 |
| 2022/0223640 A1 * | 7/2022 | Meng | H01L 27/14616 |
| 2023/0035724 A1 * | 2/2023 | Liu | H01L 27/14678 |

* cited by examiner

*Primary Examiner* — Jarrett J Stark
(74) *Attorney, Agent, or Firm* — IPro, PLLC

(57) ABSTRACT

An array substrate includes a substrate, the array substrate includes a display region and a detection region. And the detection region includes a thin film transistor located on the substrate and a photodiode located on one side of the thin film transistor away from the substrate, and the array substrate further includes a first inorganic protective layer, an organic protective layer and a second inorganic protective layer located between the thin film transistor and the photodiode. And the first inorganic protective layer, the organic protective layer and the second inorganic protective layer are stacked in sequence in a direction away from the substrate, and an orthographic projection of the photodiode on the substrate is within the range of the orthographic projection of the organic protective layer on the substrate.

16 Claims, 1 Drawing Sheet

ARRAY SUBSTRATE, FLAT PANEL DETECTOR, AND METHOD FOR MANUFACTURING ARRAY SUBSTRATE

CROSS-REFERENCE TO RELATED APPLICATIONS

The present application claims priority to Chinese Patent Application No. 202110219223.7 filed in China on Feb. 26, 2021, which is incorporated herein by reference in its entirety.

TECHNICAL FIELD

The present disclosure relates to the field of detection technology, and more particularly, to an array substrate, a flat panel detector, and a method for manufacturing the array substrate.

BACKGROUND

A photodiode can be arranged on the array substrate as a light sensor to achieve detection of brightness. Such an array substrate is applied to a display device to detect ambient brightness to compensate for a display effect, and can also be applied to a medical apparatus such as a flat panel detector for performing X-ray detection. Photodiode manufacturing process always requires deposition in a gaseous atmosphere of silicon hydride or hydrogen, or hydrogen ambient. In a hydrogen environment for a long time, the semiconductor layer of the thin film transistor on the array substrate can be adversely affected, adversely affecting the performance of the array substrate.

SUMMARY

In a first aspect, an embodiment of the present disclosure provides an array substrate, wherein the array substrate includes a substrate, the array substrate includes a display region and a detection region, the detection region includes a thin film transistor located on the substrate, and a photodiode located on one side of the thin film transistor away from the substrate, the array substrate further includes a first inorganic protective layer, an organic protective layer, and a second inorganic protective layer located between the thin film transistor and the photodiode, and the first inorganic protective layer, organic protective layer and second inorganic protective layer are stacked in sequence in a direction away from the substrate, and the orthographic projection of the photodiode on the substrate is within the range of the orthographic projection of the organic protective layer on the substrate.

According to one possible embodiment of the present disclosure, the thin film transistor includes a first thin film transistor, the first thin film transistor includes a first source-drain metal layer, the array substrate further includes a second source-drain metal layer, the second source-drain metal layer is located on one side of the first source-drain metal layer away from the substrate and connected to the first source-drain metal layer, and the orthographic projection of the photodiode on the substrate is within the range of the orthographic projection of the second source-drain metal layer on the substrate.

According to one possible embodiment of the present disclosure, in a first direction, a side end point of the orthographic projected edge of the organic protective layer on the substrate is located between a corresponding side end point of the orthographic projected edge of the first source-drain metal layer on the substrate and a corresponding side end point of the orthographic projected edge of the second source-drain metal layer on the substrate, and the other end point of the orthographic projected edge of the organic protective layer on the substrate is located between the corresponding other end point of the orthographic projected edge of the first source-drain metal layer on the substrate and the corresponding other end point of the orthographic projected edge of the second source-drain metal layer on the substrate. And the orthographic projection of the second source-drain metal layer on the substrate completely or partially covers the orthographic projection of the first source-drain metal layer on the substrate; and the first direction is a direction of a width of the organic protective layer.

According to one possible embodiment of the disclosure, the array substrate further includes: a transparent conductive layer located on one side of the photodiode away from the substrate. And the transparent conductive layer is connected to the photodiode; in a second direction, one side end point of the orthographic projected edge of the organic protective layer on the substrate is located between the corresponding one side end point of the orthographic projected edge of the first source-drain metal layer on the substrate and the corresponding one side end point of the orthographic projected edge of the transparent conductive layer on the substrate, and the other side end point of the orthographic projected edge of the organic protective layer on the substrate is located between the corresponding other side end point of the orthographic projected edge of the first source-drain metal layer on the substrate and the corresponding other side end point of the orthographic projected edge of the transparent conductive layer on the substrate; and the second direction is a direction of a length of the organic protective layer.

According to one possible embodiment of the present disclosure, the material of the organic protective layer includes a photoresist hydrogen-stable material having a curing temperature of not more than 260 degrees centigrade.

According to one possible embodiment of the present disclosure, the first thin film transistor includes a semiconductor layer, wherein the orthographic projection of the second source-drain metal layer on the substrate completely or partially covers the orthographic projection of the semiconductor layer on the substrate.

According to one possible embodiment of the present disclosure, the orthographic projection of the first inorganic protective layer on the substrate and the orthographic projection of the second inorganic protective layer on the substrate completely or partially overlap.

According to one possible embodiment of the disclosure, the array substrate further includes: a light shielding layer and a buffer layer located between the thin film transistor and the substrate. And the buffer layer is located on one side of the light shielding layer away from the substrate, the light shielding layer includes a plurality of mutually independent light shielding layer patterns, the orthographic projection of each of the light shielding layer patterns on the substrate completely or partially covers the orthographic projection of a semiconductor layer of one thin film transistor on the substrate, the thin film transistor further includes a second thin film transistor, and the semiconductor layer or the gate electrode layer of the second thin film transistor is connected to the corresponding light shielding layer pattern.

According to one possible embodiment of the present disclosure, the organic protective layer further includes a sensitizer, wherein the sensitizer includes at least one of a diazide sensitizer, a cinnamic acid sensitizer, and a polyhydrocarbon sensitizer.

In a second aspect, embodiments of the present disclosure also provide a flat panel detector including the array substrate. And the array substrate includes a substrate, the array substrate includes a display region and a detection region, the detection region includes a thin film transistor located on the substrate, and a photodiode located on one side of the thin film transistor away from the substrate, the array substrate further includes a first inorganic protective layer, an organic protective layer, and a second inorganic protective layer located between the thin film transistor and the photodiode, and the first inorganic protective layer, organic protective layer and second inorganic protective layer are stacked in sequence in a direction away from the substrate, and the orthographic projection of the photodiode on the substrate is within the range of the orthographic projection of the organic protective layer on the substrate.

According to one possible embodiment of the present disclosure, the thin film transistor includes a first thin film transistor, the first thin film transistor includes a first source-drain metal layer, the array substrate further includes a second source-drain metal layer, the second source-drain metal layer is located on one side of the first source-drain metal layer away from the substrate and connected to the first source-drain metal layer, and the orthographic projection of the photodiode on the substrate is within the range of the orthographic projection of the second source-drain metal layer on the substrate.

According to one possible embodiment of the present disclosure, in a first direction, a side end point of the orthographic projected edge of the organic protective layer on the substrate is located between a corresponding side end point of the orthographic projected edge of the first source-drain metal layer on the substrate and a corresponding side end point of the orthographic projected edge of the second source-drain metal layer on the substrate, and the other end point of the orthographic projected edge of the organic protective layer on the substrate is located between the corresponding other end point of the orthographic projected edge of the first source-drain metal layer on the substrate and the corresponding other end point of the orthographic projected edge of the second source-drain metal layer on the substrate. And the orthographic projection of the second source-drain metal layer on the substrate completely or partially covers the orthographic projection of the first source-drain metal layer on the substrate; and the first direction is a direction of a width of the organic protective layer.

According to one possible embodiment of the disclosure, the array substrate further includes: a transparent conductive layer located on one side of the photodiode away from the substrate. And the transparent conductive layer is connected to the photodiode. In a second direction, one side end point of the orthographic projected edge of the organic protective layer on the substrate is located between the corresponding one side end point of the orthographic projected edge of the first source-drain metal layer on the substrate and the corresponding one side end point of the orthographic projected edge of the transparent conductive layer on the substrate, and the other side end point of the orthographic projected edge of the organic protective layer on the substrate is located between the corresponding other side end point of the orthographic projected edge of the first source-drain metal layer on the substrate and the corresponding other side end point of the orthographic projected edge of the transparent conductive layer on the substrate; and the second direction is a direction of a length of the organic protective layer.

According to one possible embodiment of the present disclosure, the material of the organic protective layer includes a photoresist hydrogen-stable material having a curing temperature of not more than 260 degrees centigrade.

According to one possible embodiment of the present disclosure, the first thin film transistor includes a semiconductor layer, wherein the orthographic projection of the second source-drain metal layer on the substrate completely or partially covers the orthographic projection of the semiconductor layer on the substrate.

According to one possible embodiment of the present disclosure, the orthographic projection of the first inorganic protective layer on the substrate and the orthographic projection of the second inorganic protective layer on the substrate completely or partially overlap.

According to one possible embodiment of the disclosure, the array substrate further includes: a light shielding layer and a buffer layer located between the thin film transistor and the substrate. And the buffer layer is located on one side of the light shielding layer away from the substrate, the light shielding layer includes a plurality of mutually independent light shielding layer patterns, the orthographic projection of each of the light shielding layer patterns on the substrate completely or partially covers the orthographic projection of a semiconductor layer of one thin film transistor on the substrate, the thin film transistor further includes a second thin film transistor, and the semiconductor layer or the gate electrode layer of the second thin film transistor is connected to the corresponding light shielding layer pattern.

According to one possible embodiment of the present disclosure, the organic protective layer further includes a sensitizer, wherein the sensitizer includes at least one of a diazide sensitizer, a cinnamic acid sensitizer, and a polyhydrocarbon sensitizer.

In a third aspect, embodiments of the present disclosure also provide a method for manufacturing the array substrate which includes: providing a substrate; forming a thin film transistor on the substrate; forming a first inorganic protective layer, an organic protective layer, and a second inorganic protective layer which are sequentially stacked and arranged in a direction away from the substrate on one side of the thin film transistor away from the substrate; and forming a photodiode on one side of the second inorganic protective layer away from the substrate, wherein the orthographic projection of the photodiode on the substrate is within the range of the orthographic projection of the organic protective layer on the substrate.

According to one possible embodiment of the present disclosure, one side of the thin film transistor away from the substrate is provided with a first inorganic protective layer, an organic protective layer, and a second inorganic protective layer which are stacked in sequence in a direction away from the substrate, which includes: depositing a first inorganic material layer on one side of the thin film transistor away from the substrate; forming an organic protective layer on one side of the first inorganic material layer away from the substrate; depositing a second inorganic material layer on one side of the organic protective layer away from the substrate; and patterning the first inorganic material layer and the second inorganic material layer through a patterning process, wherein the patterned first inorganic material layer forms a first inorganic protective layer and the patterned second inorganic material layer forms a second inorganic protective layer.

BRIEF DESCRIPTION OF THE DRAWINGS

In order that the manner in which the embodiments of the present disclosure are recited in detail, a brief description of the drawings that accompany the detailed description of the embodiments of the present disclosure is provided below. It is to be understood that the appended drawings are illustrative of only some embodiments of the present disclosure. For a person of ordinary skill in the art, other figures can also be obtained according to these figures without involving any inventive effort.

DESCRIPTION OF EMBODIMENTS

The technical solution of embodiments of the present disclosure will now be described more fully hereinafter with reference to the accompanying drawings, in which some, but not all embodiments of the disclosure are shown. All other embodiments obtained by those of ordinary skill in the art on the basis of the embodiments in the application without creative work shall fall within the scope of protection of the disclosure.

Embodiments of the present disclosure provide an array substrate.

In the present embodiment, the array substrate includes a substrate 101, wherein the substrate 101 can be selected from a glass substrate and a flexible substrate such as polyimide (PI).

Figure 1:
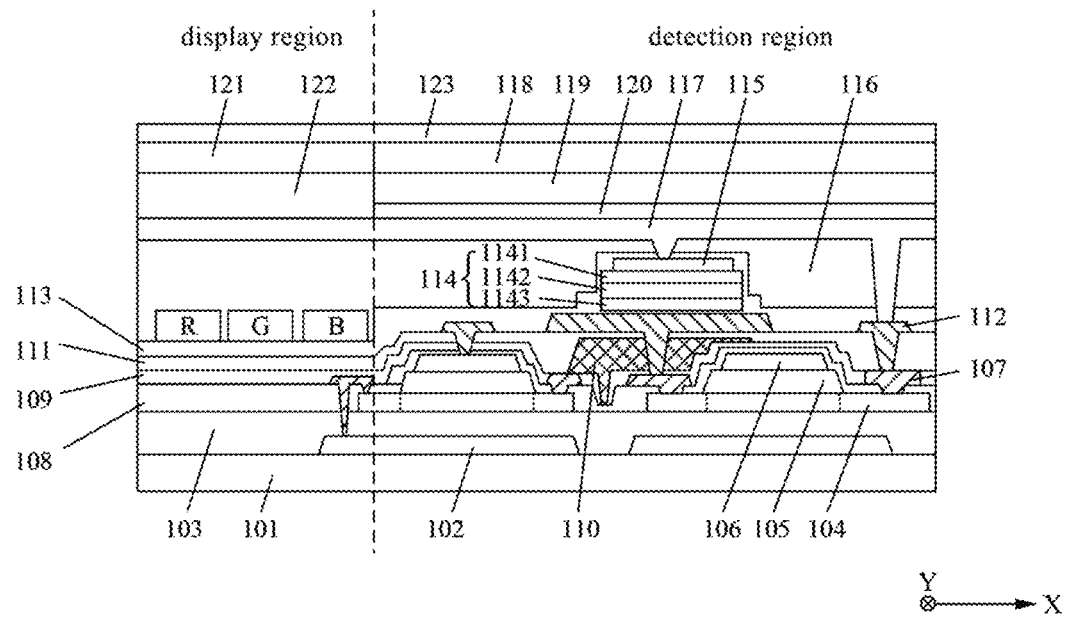
FIG. 1 is a schematic structural diagram of a array substrate provided by embodiments of the present disclosure.
Figure 2:
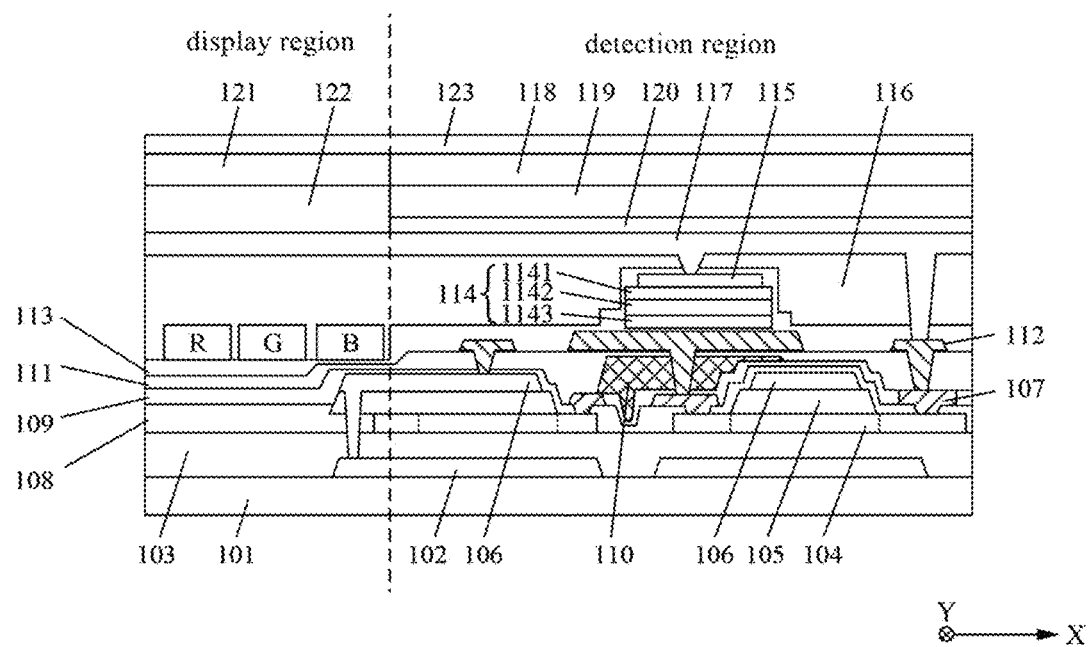
FIG. 2 is a schematic structural diagram of another array substrate provided by embodiments of the present disclosure.

As shown in FIG. 1 and FIG. 2, in one embodiment, the array substrate includes a display region and a detection region. Specifically the display region is used for implementing a normal display function and the detection region includes a thin film transistor (TFT) located on the substrate 101 and a photodiode 114 located on one side of the thin film transistor away from the substrate 101. The photodiode 114 can be a PIN photodiode 114. The PIN photodiode 114 includes a P-I-N structure composed of a P-type semiconductor layer 1411, an intrinsic semiconductor layer 1412, and an N-type semiconductor layer 1413, which are sequentially stacked and are not further defined and described herein.

In some embodiments, the array substrate can be applied on a display device for brightness detection, for example: can be used for detecting display brightness and ambient brightness and further compensating for the display device.

As shown in FIGS. 1 and 2, in other embodiments, the array substrate can be applied on an X-ray detection device.

With continued reference to FIGS. 1 and 2, an exemplary array substrate includes a substrate 101, a light shielding layer 102, a buffer layer 103, a semiconductor layer 104 (active layer), a gate insulating layer 105, a gate layer 106, a first source-drain metal layer 107, a dielectric layer 108, a first inorganic protective layer 109, an organic protective layer 110, a second inorganic protective layer 111, a second source-drain metal layer 112, a third inorganic protective layer 113, a photodiode 114, a transparent conductive layer 115, a resin layer 116, and a common electrode layer 117. Of course, it should be understood by those skilled in the art that the array substrate can include other film layers and components in addition to the above-mentioned film layers and components according to actual needs, or the film layers and components mentioned above are removed without any limitation herein.

The display region includes pixel units, and the pixel units include sub-pixels of different colors. Illustratively, the different colored sub-pixels can include, for example, a red sub-pixel R, a green sub-pixel G, and a blue sub-pixel B, wherein the sub-pixels with different colors can be realized by a light-emitting unit with a corresponding color, and can also be realized by a light-emitting unit combined with a color filter. The light-emitting unit is composed of a driving electrode 121, a light-emitting layer 122, and a common electrode layer 117 together.

On the other hand, the detection region further includes a scintillator 118, a pixel definition layer (PDL) 119, and an insulating layer 120. Further, a cover plate 123 can be provided on one side of the scintillator 118 away from the substrate 101.

For example, the X-ray detection device can realize detection of X-rays by an indirect conversion method, wherein the indirect conversion method refers to receive X-rays emitted by an object by using the scintillator 118, which includes a fluorescent agent, and the material of the fluorescent agent can include $Gd_2O_2S$ gadolinium sulfide, etc. In operation, when X-rays illuminate the scintillator 118, the scintillator 118 is capable of producing visible light to convert the X-rays into optical signals. The converted light is then detected by the photodiodes 114, light emitted by each pixel located, for example, at an interval of 50-150 micrometers from the scintillator 118, are converted into electrical charges by the photodiodes 114. Furthermore, these charges are transmitted as voltage signals through the thin film transistor. Finally, a two-dimensional image is generated from the obtained voltage signals.

In this embodiment, the array substrate further includes a first inorganic protective layer 109 (PVX1), an organic protective layer 110, and a second inorganic protective layer 111 (PVX2) between the thin film transistor and the photodiode 114. The first inorganic protective layer 109, the organic protective layer 110, and the second inorganic protective layer 111 are sequentially stacked in a direction away from the substrate 101. Additionally, as a non-limiting example, the orthographic projection of the photodiode 114 on the substrate 101 is, for example, within the range of the orthographic projection of the organic protective layer 110 on the substrate 101.

In the manufacturing process of the photodiode 114, it is desirable to perform the deposition of the material under a gaseous condition of silicon hydride and hydrogen, also referred to as a hydrogen atmosphere or hydrogen environment. The semiconductor layer 104 of the thin film transistor typically includes a metal oxide, such as indium gallium zinc oxide (IGZO). Since the metal oxide has a relatively high mobility, it is more suitable as a material for the semiconductor layer 104. Under a hydrogen environment for a long period of time, the semiconductor of the metal oxide is easily conducted and its normal function is affected.

By forming the organic protective layer 110 between the photodiode 114 and the thin film transistor in this embodiment, it is possible to reduce the possibility of diffusion of hydrogen elements to the semiconductor layer 104 during deposition of the photodiode 114 through the organic protective layer 110, thereby contributing to further improve the reliability of the thin film transistor on the array substrate.

By forming the organic protective layer 110 covering the semiconductor layer 104 in the embodiments of the present disclosure, the organic protective layer 110 can be used to block the possibility of diffusion of hydrogen (silicon hydride gas and/or hydrogen gas) to the semiconductor layer 104 during manufacturing process of the photodiode 114. Furthermore, by providing the second inorganic protective layer 111, with the organic protective layer 110 locating between the first inorganic protective layer 109 and the second inorganic protective layer 111, it is possible to effectively prevent the material of the organic protective layer 110 from contaminating the photodiode 114 during the manufacturing process of the photodiode 114 and is helpful to further improve the reliability of the array substrate.

In some of these embodiments, the thin film transistor includes a first thin film transistor, wherein the first thin film transistor includes a first source-drain metal layer 107, the array substrate further includes a second source-drain metal layer 112, wherein the second source-drain metal layer 112 is located on one side of the first source-drain metal layer 107 away from the substrate 101 and is connected to the first source-drain metal layer 107, and the orthographic projection of the photodiode 114 on the substrate 101 is located within the range of the orthographic projection of the second source-drain metal layer 112 on the substrate 101, as shown in FIGS. 1 and 2. In particular, as can be understood by those skilled in the art, in the figures, portions having the same filling effect indicate the same film layers or components.

In the present embodiment, the first thin film transistor is used to transmit electric signals generated by the corresponding photodiode 114. In operation, the photodiode 114 is sensitive to generate the electrical signals, wherein the electrical signals are transmitted to the corresponding first thin film transistor through the transparent conductive layer 115, and when the first thin film transistor is turned on, the electrical signals can be transmitted to the second source-drain metal layer 112 through the first thin film transistor, and output through the second source-drain metal layer 112.

In some of these embodiments, the minimum distance between the edge of the orthographic projection of the photodiode 114 on the substrate 101 and the edge of the orthographic projection of the second source-drain metal layer 112 on the substrate 101 is not less than about 7 micrometers. By controlling the relative positions of the orthographic projection of the photodiode 114 and the orthographic projection of the second source-drain metal layer 112 in the present embodiment, the possible effect of ambient light on the photodiode 114 can be reduced and the signal-to-noise ratio can be increased to further improve the accuracy of the detection results.

In some of these embodiments, in a first direction (X-direction), the orthographic projected edge of the organic protective layer 110 on the substrate 101 is between the edge of the orthographic projection of the first source-drain metal layer 107 on the substrate 101 and the edge of the orthographic projection of the second source-drain metal layer 112 on the substrate 101, wherein the orthographic projection of the second source-drain metal layer 112 on the substrate 101 completely or partially covers the orthographic projection of the first source-drain metal layer 107 on the substrate 101. Specifically, the edge of the orthographic projection of the organic protective layer 110 on the substrate 101 being located between the edge of the orthographic projection of the first source-drain metal layer 107 on the substrate 101 and the edge of the orthographic projection of the second source-drain metal layer 112 on the substrate 101 means that the one-side endpoint of the edge of the orthographic projection of the organic protective layer 110 on the substrate 101 is located between the corresponding one-side endpoint of the edge of the orthographic projection of the first source-drain metal layer 107 on the substrate 101 and the corresponding one-side endpoint of the edge of the orthographic projection of the second source-drain metal layer 112 on the substrate 101. And the other side endpoint of the edge of the orthographic projection of the organic protective layer 110 on the substrate 101 is located between the corresponding other side endpoint of the edge of the orthographic projection of the first source-drain metal layer 107 on the substrate 101 and the corresponding other side endpoint of the edge of the orthographic projection of the second source-drain metal layer 112 on the substrate 101.

In some of these embodiments, illustratively, the array substrate also includes the transparent conductive layer 115 on one side of the photodiode 114 away from the substrate 101, and the transparent conductive layer 115 is coupled to the photodiode 114. In the second direction (Y-direction), the edge of the orthographic projection of the organic protective layer 110 on the substrate 101 is located between the edge of the orthographic projection of the first source-drain metal layer 107 on the substrate 101 and the edge of the orthographic projection of the transparent conductive layer 115 on the substrate 101. Specifically, the edge of the orthographic projection of the organic protective layer 110 on the substrate 101 being located between the edge of the orthographic projection of the first source-drain metal layer 107 on the substrate 101 and the edge of the orthographic projection of the transparent conductive layer 115 on the substrate 101 means that the one-side endpoint of the edge of the orthographic projection of the organic protective layer 110 on the substrate 101 is located between the corresponding one-side endpoint of the edge of the orthographic projection of the first source-drain metal layer 107 on the substrate 101 and the corresponding one-side endpoint of the edge of the orthographic projection of the transparent conductive layer 115 on the substrate 101. And the other side endpoint of the edge of the orthographic projection of the organic protective layer 110 on the substrate 101 is located between the corresponding other side endpoint of the edge of the orthographic projection of the first source-drain metal layer 107 on the substrate 101 and the corresponding other side endpoint of the edge of the orthographic projection of the transparent conductive layer 115 on the substrate 101.

In the present embodiment, the first direction (X-direction) is the direction of the width of the organic protective layer 110, and the second direction (Y-direction) is the direction of the length of the organic protective layer 110. By controlling the relative positions of the organic protective layer 110 and the photodiode 114 in the present embodiment, the dark current can be reduced without affecting the photocurrent, which is helpful to further improve the detection accuracy.

In some of these embodiments, the material of the organic protective layer 110 includes a photoresist hydrogen-stable material. In the present embodiment, the effect of good photostability of hydrogen blocking can be achieved through the interaction of organic substances; specifically, the hydrogen blocking additive can be an organic substance, and a hydrogen blocking effect can be achieved through the interaction or reaction between organic substances; and the specific substance type can be flexibly selected according to actual requirements. For example, a polyimide-based material having a certain degree of polymerization can be selected and an existing or improved hydrogen blocking additive can be further added to form a photoresistive hydrogen-stabilizing material.

The curing temperature of the photoresist hydrogen-stable material is not greater than 260 degrees centigrade. Illustratively, the curing temperature can be controlled at 180 to 230 degrees centigrade so that the organic protective layer 110 is relatively low to avoid the effects of high temperature processes on the thin film transistor. The decomposition temperature of the selected photoresist hydrogen-stable material needs to be relatively high, specifically no less than 450 degrees centigrade in the present embodiment, in order to avoid decomposition of the photoresist hydrogen-stable material at high temperatures during the manufacturing process of the photodiode 114.

In the present embodiment, the curing temperature and the decomposition temperature of the photoresist hydrogen-stable material can be achieved through the coordination between organics. Illustratively, the temperature requirements described above can be met by controlling the degree of polymerization of the polyimide-based material.

In addition, a sensitizer can be further added to the organic protective layer 110. The sensitizer can be selected from at least one of a diazide sensitizer, a cinnamic acid sensitizer, and a polyhydrocarbon sensitizer. The sensitizer is mainly used to increase the opacity of the organic protective layer 110 under illumination conditions. It should be understood that the material of the active layer of the thin film transistor includes a semiconductor, the electrical properties of which are susceptible to light exposure, and the addition of the sensitizer to the organic protective layer 110 helps to reduce the adverse effect of light from the photodiode 114 on the performance of the thin film transistor.

In some of these embodiments, the first thin film transistor includes a semiconductor layer 104 and the orthographic projection of the second source-drain metal layer 112 on the substrate 101 covers at least a portion of the orthographic projection of the semiconductor layer 104 on the substrate 101. By controlling the second source-drain metal layer 112 to cover the semiconductor layer 104 to some extent, it is possible to prevent diffusion of hydrogen (silicon hydride gas and/or hydrogen gas) to the semiconductor layer 104 of the first thin film transistor by using the second source-drain metal layer 112, and is helpful to further improving the protective effect on the semiconductor layer 104 of the target transistor.

In some of these embodiments, for example, the orthographic projection of the first inorganic protective layer 109 on the substrate 101 and the orthographic projection of the second inorganic protective layer 111 on the substrate 101 partially or completely overlap.

In the present embodiment, the first inorganic protective layer 109 is mainly used for protecting the thin film transistor and the second inorganic protective layer 111 is mainly used for protecting the photodiode 114. It should be understood that a dry etch step may be included in the manufacturing process of the photodiode 114, and the dry etch step may produce an over-etch causing the material of the organic protective layer 110 to contaminate the sidewalls of the photodiode 114.

By providing the second inorganic protective layer 111, contamination of the photodiode 114 by the material of the organic protective layer 110 during subsequent manufacturing of the photodiode 114 can be avoided. At the same time, by arranging the orthographic projection of the first inorganic protective layer 109 on the substrate 101 and the orthographic projection of the second inorganic protective layer 111 on the substrate 101 to overlap, the first inorganic protective layer 109 and the second inorganic protective layer 111 can be manufactured at one time by one patterning process, which is helpful to save process steps and reduce costs.

In some of these embodiments, illustratively, the array substrate further includes the light shielding layer 102 and the buffer layer 103 between the thin film transistor and the substrate 101. The buffer layer 103 is located on one side of the light shielding layer 102 away from the substrate 101. The light shielding layer 102 includes, for example, a plurality of mutually independent light shielding layer 102 patterns, the orthographic projection of each light shielding layer 102 pattern on the substrate 101 completely or partially covers the orthographic projection of the semiconductor layer 104 of one thin film transistor on the substrate 101. In addition, the thin film transistor further includes the second thin film transistor, for example, the semiconductor layer 104 or the gate electrode layer 106 of the second thin film transistor is connected to the corresponding light shielding layer 102 pattern.

The light shielding layer 102 is mainly used for shielding light that may illuminate the thin film transistor, and is helpful to further improve the stability of the thin film transistor.

The second thin film transistor in the present embodiment refers to the thin film transistor which is used for driving a pixel cell to realize a display function. Thus, the semiconductor layer 104 or the gate electrode layer 106 of the second thin film transistor is connected to the corresponding light shielding layer 102 pattern. Thus, the light shielding layer 102 and the second thin film transistor together constitute a double-gate thin film transistor, which is helpful to further improve the drive control effect for the display process.

In the embodiments of the present disclosure, a flat panel detector is also provided, which includes the array substrate described previously.

The flat panel detector according to the embodiments of the present disclosure includes all the technical solutions of the above-mentioned array substrate embodiments, and thus at least all the above-mentioned technical effects can be achieved, which will not be described in detail herein.

The embodiments of the present disclosure also provide a method for manufacturing the array substrate.

The method is used for manufacturing the array substrate of any of the above. In one embodiment, referring to FIGS. 1 and 2, the method for manufacturing the array substrate includes, for example, the following steps: providing the substrate 101; forming the thin film transistor on the substrate 101; forming the first inorganic protective layer 109, the organic protective layer 110, and the second inorganic protective layer 111 which are sequentially stacked and arranged in a direction away from the substrate 101 on one side of the thin film transistor away from the substrate 101; and forming the photodiode 114 on one side of the second inorganic protective layer 111 away from the substrate 101, wherein the orthographic projection of the photodiode 114 on the substrate 101 is within the range of the orthographic projection of the organic protective layer 110 on the substrate 101.

In the technical solutions of the present embodiment, the manufactured array substrate is any one of array substrates in the above-mentioned embodiments, and the description thereof will not be repeated here.

In some of the embodiments, before forming the first inorganic protective layer 109, the organic protective layer 110, and the second inorganic protective layer 111 which are stacked in sequence in the direction away from the substrate on tone side of the thin film transistor away from the substrate, the method for forming the array substrate further includes, for example: forming a dielectric layer 108 on one side of the thin film transistor away from the substrate 101.

In the present embodiment, the material of the dielectric layer 108 needs to be deposited first and then patterned to form the dielectric layer 108. In the present embodiment, in the process of depositing the material of the dielectric layer 108, a deposition power is, for example, 1300 to 1800 W, a deposition pressure is, for example, 1800 to 2400 mTorr, and a deposition time is, for example, 220 to 280 seconds.

In the solutions of the present embodiment, the deposition power and the deposition pressure are significantly increased, and the deposition time is extended, so that a relatively dense and relatively thick dielectric layer can be formed, which is helpful to improve barrier capability against hydrogen (silicon hydride gas and/or hydrogen gas).

In some of these embodiments, the step of forming the first inorganic protective layer 109, the organic protective layer 110, and the second inorganic protective layer 111 which are sequentially stacked and arranged in a direction away from the substrate 101 on one side of the thin film transistor away from the substrate 101 includes: depositing the first inorganic material layer on one side of the thin film transistor away from the substrate 101; forming the organic protective layer 110 on one side of the first inorganic material layer away from the substrate 101; depositing the second inorganic material layer on one side of the organic protective layer 110 away from the substrate 101; and patterning the first inorganic material layer and the second inorganic material layer by one patterning process. Specifically, the patterned first inorganic material layer forms the first inorganic protective layer 109, and the patterned second inorganic material layer forms the second inorganic protective layer 111.

It should be understood that in the technical solution of the present embodiment, the first protective layer is mainly used to form protection for the thin film transistor, and the second protective layer is mainly used to form protection for the organic protective layer. Therefore, it can be understood that in this embodiment, by one patterning process, the first inorganic material layer forms the first inorganic protective layer and the second inorganic material layer forms the second inorganic protective layer, so as to save process steps.

The above embodiments are merely specific implementation modes of the present disclosure, but the scope of protection of the present disclosure is not limited thereto, and any modification and substitution be apparent to those skilled in the art without departing from the technical scope of the present disclosure shall covered by the scope protection of the present disclosure. Accordingly, the scope of protection of the present disclosure is as set forth in the claims.

What is claimed is:

1. An array substrate, comprising a substrate, wherein the array substrate comprises a display region and a detection region, wherein the detection region comprises (i) a thin film transistor located on the substrate, and (ii) a photodiode located on one side of the thin film transistor away from the substrate,
wherein the array substrate further comprises a first inorganic protective layer, an organic protective layer, and a second inorganic protective layer located between the thin film transistor and the photodiode, wherein the first inorganic protective layer, the organic protective layer, and second inorganic protective layer are stacked in sequence in a direction away from the substrate, an orthographic projection of the photodiode on the substrate is within the range of the orthographic projection of the organic protective layer on the substrate;
wherein a material of the organic protective layer comprises a photoresist hydrogen-stable material, wherein a curing temperature of the photoresist hydrogen-stable material is not greater than 260 degrees centigrade.

2. The array substrate according to claim 1, wherein the thin film transistor comprises a first thin film transistor, the first thin film transistor comprises a first source-drain metal layer, the array substrate further comprises a second source-drain metal layer, the second source-drain metal layer is located on one side of the first source-drain metal layer away from the substrate and connected to the first source-drain metal layer, and the orthographic projection of the photodiode on the substrate is located within the range of the orthographic projection of the second source-drain metal layer on the substrate.

3. The array substrate according to claim 2, wherein in a first direction, one side end point of the orthographic projected edge of the organic protective layer on the substrate is located between a corresponding one side end point of the orthographic projected edge of the first source-drain metal layer on the substrate and a corresponding one side end point of the orthographic projected edge of the second source-drain metal layer on the substrate, and the other end point of the orthographic projected edge of the organic protective layer on the substrate is located between the corresponding other end point of the orthographic projected edge of the first source-drain metal layer on the substrate and the corresponding other end point of the orthographic projected edge of the second source-drain metal layer on the substrate,
wherein the orthographic projection of the second source-drain metal layer on the substrate completely or partially covers the orthographic projection of the first source-drain metal layer on the substrate; and
wherein the first direction is a direction of a width of the organic protective layer.

4. The array substrate according to claim 3, further comprising: a transparent conductive layer located on one side of the photodiode away from the substrate,
wherein the transparent conductive layer is connected to the photodiode;
wherein in a second direction, one side end point of the orthographic projected edge of the organic protective layer on the substrate is located between the corresponding one side end point of the orthographic projected edge of the first source-drain metal layer on the substrate and the corresponding one side end point of the orthographic projected edge of the transparent conductive layer on the substrate, and the other side end point of the orthographic projected edge of the organic protective layer on the substrate is located between the corresponding other side end point of the orthographic projected edge of the first source-drain metal layer on the substrate and the corresponding other side end point of the orthographic projected edge of the transparent conductive layer on the substrate; and
wherein the second direction is a direction of a length of the organic protective layer.

5. The array substrate according to claim 2, wherein the first thin film transistor comprises a semiconductor layer, wherein the orthographic projection of the second source-drain metal layer on the substrate completely or partially covers the orthographic projection of the semiconductor layer on the substrate.

6. The array substrate according to claim 1, wherein the orthographic projection of the first inorganic protective layer on the substrate and the orthographic projection of the second inorganic protective layer on the substrate completely or partially overlap.

7. The array substrate according to claim 1, further comprising: a light shielding layer and a buffer layer located between the thin film transistor and the substrate,
wherein the buffer layer is located on one side of the light shielding layer away from the substrate, the light shielding layer comprises a plurality of mutually independent light shielding layer patterns, the orthographic projection of each of the light shielding layer patterns on the substrate completely or partially covers the orthographic projection of a semiconductor layer of one thin film transistor on the substrate,
wherein the thin film transistor further comprises a second thin film transistor, and the semiconductor layer or the gate electrode layer of the second thin film transistor is connected to the corresponding light shielding layer pattern.

8. The array substrate according to claim 1, wherein the organic protective layer further comprises a sensitizer, which comprises at least one of a diazide sensitizer, a cinnamic acid sensitizer, and a polyhydrocarbon sensitizer.

9. A flat panel detector, comprising an array substrate, wherein the array substrate comprises a substrate, the array substrate comprises a display region and a detection region, the detection region comprises (i) a thin film transistor located on the substrate, and (ii) a photodiode located on one side of the thin film transistor away from the substrate,
wherein the array substrate further comprises a first inorganic protective layer, an organic protective layer, and a second inorganic protective layer located between the thin film transistor and the photodiode, and the first inorganic protective layer, organic protective layer and second inorganic protective layer are stacked in sequence in a direction away from the substrate, and the orthographic projection of the photodiode on the substrate is within the range of the orthographic projection of the organic protective layer on the substrate;
wherein a material of the organic protective layer comprises a photoresist hydrogen-stable material having a curing temperature of not more than 260 degrees centigrade.

10. The flat panel detector according to claim 9, wherein the thin film transistor comprises a first thin film transistor, the first thin film transistor comprises a first source-drain metal layer, the array substrate further comprises a second source-drain metal layer, the second source-drain metal layer is located on one side of the first source-drain metal layer away from the substrate and connected to the first source-drain metal layer, and the orthographic projection of the photodiode on the substrate is within the range of the orthographic projection of the second source-drain metal layer on the substrate.

11. The flat panel detector according to claim 10, wherein in a first direction, a side end point of the orthographic projected edge of the organic protective layer on the substrate is located between a corresponding side end point of the orthographic projected edge of the first source-drain metal layer on the substrate and a corresponding side end point of the orthographic projected edge of the second source-drain metal layer on the substrate, and the other end point of the orthographic projected edge of the organic protective layer on the substrate is located between the corresponding other end point of the orthographic projected edge of the first source-drain metal layer on the substrate and the corresponding other end point of the orthographic projected edge of the second source-drain metal layer on the substrate,
wherein the orthographic projection of the second source-drain metal layer on the substrate completely or partially covers the orthographic projection of the first source-drain metal layer on the substrate; and
wherein the first direction is a direction of a width of the organic protective layer.

12. The flat panel detector according to claim 11, wherein the array substrate further comprises: a transparent conductive layer located on one side of the photodiode away from the substrate,
wherein the transparent conductive layer is connected to the photodiode;
wherein in a second direction, one side end point of the orthographic projected edge of the organic protective layer on the substrate is located between the corresponding one side end point of the orthographic projected edge of the first source-drain metal layer on the substrate and the corresponding one side end point of the orthographic projected edge of the transparent conductive layer on the substrate, and the other side end point of the orthographic projected edge of the organic protective layer on the substrate is located between the corresponding other side end point of the orthographic projected edge of the first source-drain metal layer on the substrate and the corresponding other side end point of the orthographic projected edge of the transparent conductive layer on the substrate; and
wherein the second direction is a direction of a length of the organic protective layer.

13. The flat panel detector according to claim 10, wherein the first thin film transistor comprises a semiconductor layer, the orthographic projection of the second source-drain metal layer on the substrate completely or partially covers the orthographic projection of the semiconductor layer on the substrate.

14. The flat panel detector according to claim 9, wherein the orthographic projection of the first inorganic protective layer on the substrate and the orthographic projection of the second inorganic protective layer on the substrate completely or partially overlap.

15. The flat panel detector according to claim 9, wherein the array substrate further comprises: a light shielding layer and a buffer layer located between the thin film transistor and the substrate,
wherein the buffer layer is located on one side of the light shielding layer away from the substrate, the light shielding layer comprises a plurality of mutually independent light shielding layer patterns, the orthographic projection of each of the light shielding layer patterns on the substrate completely or partially covers the orthographic projection of a semiconductor layer of one thin film transistor on the substrate, the thin film transistor further comprises a second thin film transistor, and the semiconductor layer or the gate electrode layer of the second thin film transistor is connected to the corresponding light shielding layer pattern.

16. The flat panel detector according to claim 9, wherein the organic protective layer further comprises a sensitizer, wherein the sensitizer comprises at least one of a diazide sensitizer, a cinnamic acid sensitizer, and a polyhydrocarbon sensitizer.

* * * * *